(12) United States Patent
Yeh

(10) Patent No.: US 9,379,262 B2
(45) Date of Patent: Jun. 28, 2016

(54) WAFER WITH HIGH RUPTURE RESISTANCE

(71) Applicant: Jer-Liang Yeh, Taichung (TW)

(72) Inventor: Jer-Liang Yeh, Taichung (TW)

(73) Assignee: NATIONAL TSING HUA UNIVERSITY, Hsinchu (TW)

(*) Notice: Subject to any disclaimer, the term of this patent is extended or adjusted under 35 U.S.C. 154(b) by 0 days.

(21) Appl. No.: 13/623,524

(22) Filed: Sep. 20, 2012

(65) Prior Publication Data

US 2013/0069057 A1   Mar. 21, 2013

(51) Int. Cl.
*H01L 21/306* (2006.01)
*H01L 31/0368* (2006.01)
*H01L 21/02* (2006.01)

(52) U.S. Cl.
CPC .... *H01L 31/03682* (2013.01); *H01L 21/02021* (2013.01); *H01L 21/02019* (2013.01); *Y02E 10/546* (2013.01)

(58) Field of Classification Search
CPC ............. H01L 21/0201; H01L 21/02013; H01L 21/02019; H01L 21/02021; H01L 21/02334; H01L 21/02041; H01L 21/042; H01L 21/02076; H01L 21/02087
USPC .......................................... 134/3, 16; 136/257
See application file for complete search history.

(56) References Cited

U.S. PATENT DOCUMENTS

| | | | | |
|---|---|---|---|---|
| 5,332,697 A | * | 7/1994 | Smith et al. | 438/479 |
| 5,893,982 A | * | 4/1999 | Nakano | C30B 29/06 216/55 |
| 6,059,879 A | * | 5/2000 | Gonzalez | C30B 29/06 117/92 |
| 6,240,933 B1 | * | 6/2001 | Bergman | 134/1.3 |
| 6,294,019 B1 | * | 9/2001 | Miura | H01L 21/02021 117/955 |
| 6,376,395 B2 | * | 4/2002 | Vasat et al. | 438/795 |
| 7,528,002 B2 | * | 5/2009 | Samuelson | C30B 11/12 438/483 |
| 7,871,904 B2 | * | 1/2011 | An et al. | 438/473 |
| 8,212,259 B2 | * | 7/2012 | Flynn et al. | 257/76 |
| 8,222,118 B2 | * | 7/2012 | Dydyk et al. | 438/459 |
| 2001/0007795 A1 | * | 7/2001 | Kawamura et al. | 438/692 |
| 2001/0017143 A1 | * | 8/2001 | Bergman | 134/3 |
| 2004/0018392 A1 | * | 1/2004 | Yoder | 428/698 |
| 2004/0110013 A1 | * | 6/2004 | Yoder et al. | 428/446 |
| 2004/0113236 A1 | * | 6/2004 | Kurita | H01L 21/02021 257/620 |
| 2004/0157358 A1 | * | 8/2004 | Hiramatsu | C30B 25/02 438/93 |

(Continued)

FOREIGN PATENT DOCUMENTS

CN   1812053 A   8/2006
WO   WO2009141811   11/2009

OTHER PUBLICATIONS

Petra Feichtinger et al., Misfit Dislocation Nucleation Study in p/p+ Silicon, Journal of the Electrochemical Society, 148 (7) G379-G382, Jun. 4, 2001.*

*Primary Examiner* — Matthew W Such
*Assistant Examiner* — Stephen C Smith
(74) *Attorney, Agent, or Firm* — Foster Pepper PLLC; Richard A. Koske; P. G. Scott Born

(57) ABSTRACT

A wafer with high rupture resistance includes a plurality of surfaces, wherein the surfaces include a largest surface having a largest area than others and a side surface connected to the fringe of the largest surface. The side surface forms a nanostructured layer thereon to assist the stress dispersion of the wafer. Accordingly, the wafer is provided with a high rupture resistance so as to prevent the wafer from damages during semiconductor or other processes.

17 Claims, 7 Drawing Sheets

(56) References Cited

U.S. PATENT DOCUMENTS

| | | | | |
|---|---|---|---|---|
| 2008/0293253 A1* | 11/2008 | Itzkowitz | .......... | H01L 21/02021 438/745 |
| 2009/0242126 A1* | 10/2009 | Erk et al. | ................. | 156/345.18 |
| 2009/0325382 A1* | 12/2009 | Yu | .................... | H01L 21/02087 438/692 |
| 2010/0035022 A1* | 2/2010 | Yeh | .............................. | 428/141 |
| 2010/0330883 A1* | 12/2010 | Schwandner | ......... | B24B 37/042 451/41 |
| 2011/0049679 A1* | 3/2011 | Ishibashi | ............... | C30B 29/403 257/617 |
| 2011/0168976 A1* | 7/2011 | Mao | ................................ | 257/13 |
| 2011/0260296 A1* | 10/2011 | Bieck et al. | .................... | 257/619 |
| 2012/0080832 A1* | 4/2012 | Woodard | ............... | B23Q 3/084 269/289 R |
| 2012/0205821 A1* | 8/2012 | Tan et al. | ....................... | 257/787 |
| 2012/0211900 A1* | 8/2012 | Choi et al. | .................... | 257/782 |

\* cited by examiner

WAFER WITH HIGH RUPTURE RESISTANCE

PRIORITY CLAIM

This application claims the benefit of the filing date of Taiwan Patent Application No. 100133873, filed Sep. 21, 2011, entitled WAFER WITH HIGH RUPTURE RESISTANCE, and its contents are hereby incorporated by reference in their entirety.

BACKGROUND OF THE INVENTION

With the development of modern technology, portable electronic products have been widely spread, such as smart mobile phone, notebook computer, and tablet; meanwhile, these portable electronic products also became thinner and lighter to go with the tide. In the upstream industry of electronics industry, semiconductor industry has made a great contribution to the development thereof. In addition to the electronics industry, there are many industries that have high correlation with semiconductor industry, such as solar power industry, LED industry, and biotechnology industry.

In semiconductor process, the yield of wafers dominates the quality of semiconductor products; therefore, various academics and researchers have invested large sums of time and resources to investigate the manufacturing process and the material of the wafer. Moreover, no matter what kinds of the wafer is, there are many processes needed to be performed before obtaining actual products, such as wafer cutting, wafer etching, surface processing, IC packaging, and IC testing.

However, stress concentration is easily produced on the wafer (especially at the region of material defects) during the processes mentioned above. Currently, semiconductor wafers are brittle materials, such as silicon wafer; therefore, stress concentration will cause the wafer to crack and fracture.

SUMMARY OF THE INVENTION

Therefore, in order to improve the problem mentioned above, an aspect of the invention is to provide a wafer with high rupture resistance.

According to an embodiment, the wafer of the invention comprises a plurality of surfaces, wherein the surfaces includes a largest surface having a largest area and a side surface connected to a fringe of the largest surface. Moreover, there is a nanostructured layer formed on the side surface for assisting the stress dispersion of the wafer.

In the embodiment, the nanostructured layer can comprise a plurality of nanostructures, such as nanorods and nanotips. These nanostructures respectively form stress concentration points on the side surface of the wafer; when the wafer is applied with force, the plurality of stress concentration points can disperse the stress to the entire nanostructured layer, so as to prevent the stress from concentrating on the wafer and further to avoid the wafer being damaged during semiconductor or other processes.

Many other advantages and features of the present invention will be further understood by the detailed description and the accompanying sheet of drawings.

BRIEF DESCRIPTION OF THE DRAWINGS

To facilitate understanding, identical reference numerals have been used, where possible to designate identical elements that are common to the figures.

DETAILED DESCRIPTION

Figure 1:
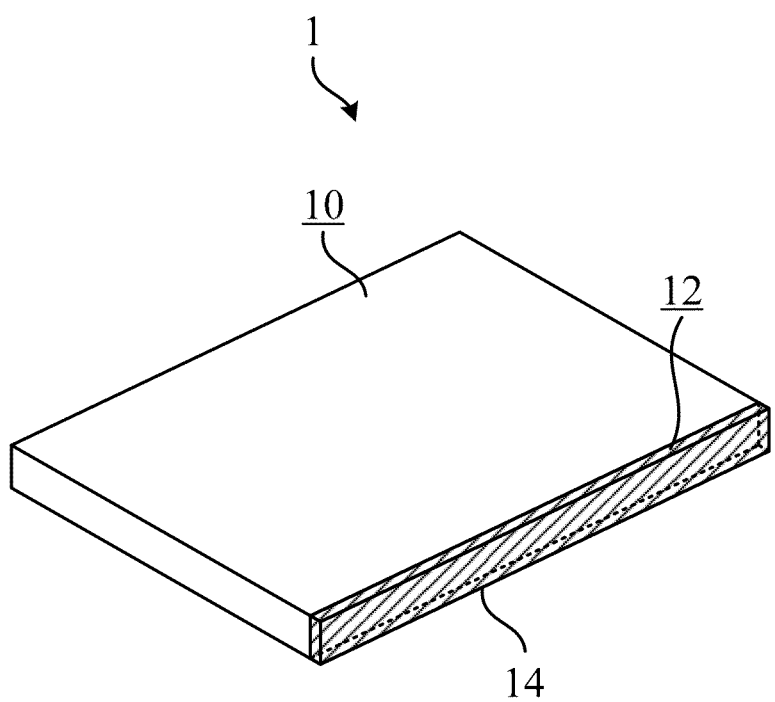
FIG. 1 is a schematic diagram of the wafer according to an embodiment of the invention.

Please refer to FIG. 1. FIG. 1 is a schematic diagram of the wafer according to an embodiment of the invention; in actual application, the wafer 1 can be one of a solar cell wafer, a LED wafer, and a semiconductor wafer, or other wafers fabricated by semiconductor process. As shown in FIG. 1, the wafer 1 of the invention comprises a plurality of surfaces, wherein the largest surface 10 which have a largest area is generally used for configuring various functional structures thereon. Take semiconductor wafer for example, gate electrode, drain electrode or source electrode can be configured on the largest surface 10; or, the wafer 1 can be a p-type semiconductor, and meanwhile, the largest surface 10 can allow an n-type semiconductor to be formed thereon, and vice versa. Besides, the electrodes mentioned above can also be configured on the largest surface 10 of the solar cell wafer or LED wafer in the same manner. To be illustrated, the conventional wafer is a sheet-like structure which has two largest surfaces opposite to each other; in order to facilitate understanding, only one largest surface is marked in the following figures.

In the embodiment, the fringe of the largest surface 10 of the wafer 1 is connected with the side surface 12; wherein the number of the side surface 12 is differed with the shape of the wafer 1. Duo to the sheet-like structure of the wafer 1, the side surface 12 is much smaller than the largest surface 10 and without extra space available to configure the functional structures. Between the side surface 12 and the largest surface 10, there is an included angle of 90°, but it is not limited to be this embodiment, the included angle can be ranged from 0° to 180°. Additionally, in another embodiment, the side surface and the largest surface are interconnected by a fillet. To be noticed, the configuration of the wafer can be predetermined in accordance with the demands of user, and is not limited to the descriptions given above.

Figure 2:
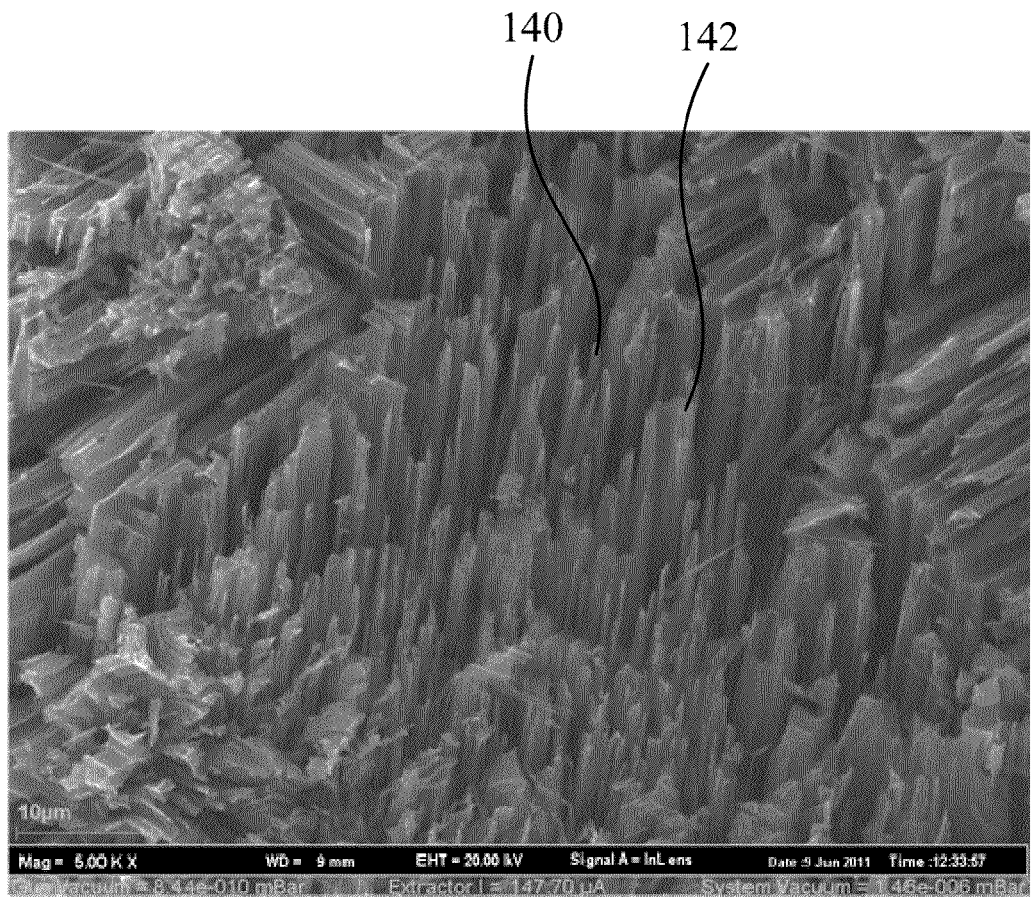
FIG. 2 is a micrograph of the nanostructured layer according to FIG. 1.
Figure 3:
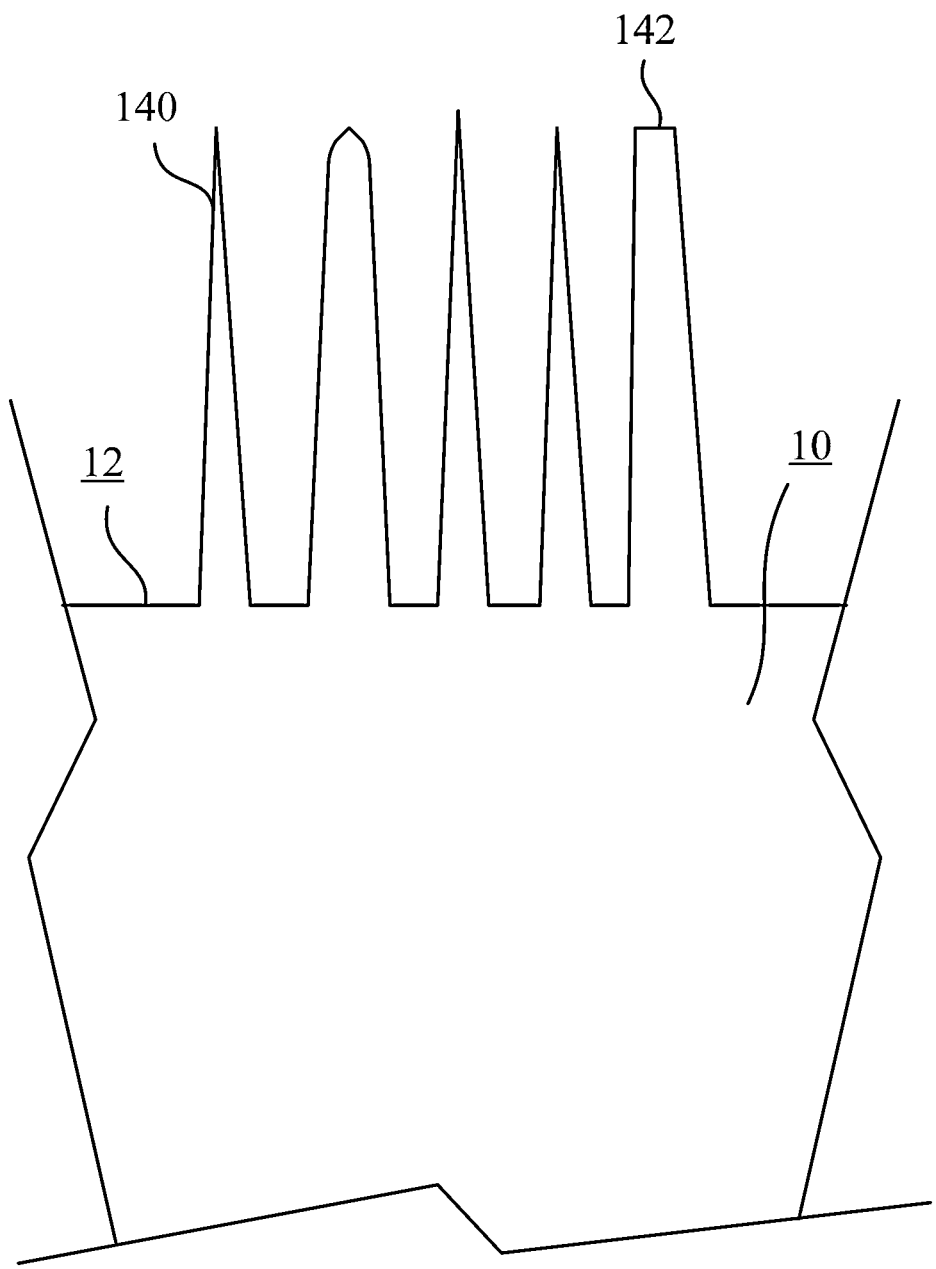
FIG. 3 is a sectional view of the nanostructured layer according to FIG. 2.

The wafer 10 further comprises a nanostructured layer 14 formed on the side surface 12 for assisting the stress dispersion of the wafer. The nanostructured layer 14 comprises a plurality of nanostructures, such as nanorods or nanotips. Please refer to FIG. 2 and FIG. 3, FIG. 2 is a micrograph of the nanostructured layer according to FIG. 1; and, FIG. 3 is a sectional view of the nanostructured layer according to FIG. 2. To be noticed, the nanostructured layer 14 is fabricated by etching the side surface 12 of the wafer 1. As shown in FIG. 2 and FIG. 3, the nanostructured layer 14 comprises the nanotips 140 and nanorods 142 which are extended outward from the side surface 12.

However, no matter with what kind of manufacturing processes, the formations of the nanotips 140 and the nanorods 142 may cause the material defect to occur on the side surface 12; in FIG. 3, the nanotips 140 and the nanorods 142 allow material defects to exist at the connecting portion of the side surface 12. Moreover, the nanostructures in the nanostructured layer 14 may be interconnected with each other, and by the same token, the material defects may be formed at the connecting portion. Furthermore, it is possible that the nanostructures have material defects within themselves. In general, stress concentration easily occurs at the region of material defects; in other words, when the wafer 1 is applied with tensile force, stress concentration may occur near the nanotips 140, the nanorods 142, the connecting portion of the both and the side surface 12, or the connecting portion of the nanostructures.

The dimension of each nanotip 140 and each nanorod 142 is quite tiny, and within the nanostructured layer 14, there are multiple nanotips 140 and nanorods 142 distributed therein. Therefore, the nanotips 140 and the nanorods 142 are the stress concentration points which can disperse the stress to the portion of the nanostructured layer 14 which covers over the side surface 12; in other words, this phenomenon is known as stress dispersion of the surface, but not stress concentration of points or lines.

That is to say, when the wafer is applied with tensile force, the stress may be dispersed to the nanostructured layer covering over the side surface; furthermore, the material defect on the wafer can prevent the wafer from intense stress concentration and damages, such as the defects formed on the functional structures of the largest surface, or the defects produced during wafer processing. As a result, the nanostructured layer in this embodiment is capable of dispersing stress, resisting tensile force, and further to enhance the rupture resistance of the wafer.

In the embodiment, the nanostructures comprise nanotips and nanorods; in actual application, the nanotips and nanorods mentioned above can be fabricated on the side surface of the wafer by electrochemical etching. For example, the nanostructured layer 14 in FIG. 2 can be fabricated by etching the side surface 12 of the wafer 1 over 40 minutes; after electrochemical etching, the nanostructures (nanotips and nanorods) have a spacing of 10 to 1000 nanometer (nm) between the tops thereof, and have a depth of 0.1 to 100 micrometer (μm). Since the dimension of each nanotip and each nanorod is quite tiny, the nanostructures would not be scraped and collapsed even under a lateral force (i.e., the force parallel to the side surface) during the wafer processing process. On the other hand, due to the tiny dimension of the nanostructures, the material properties of the wafer would not be affected at macroscopic scale, but enhance the rupture resistance only.

Figure 4A:
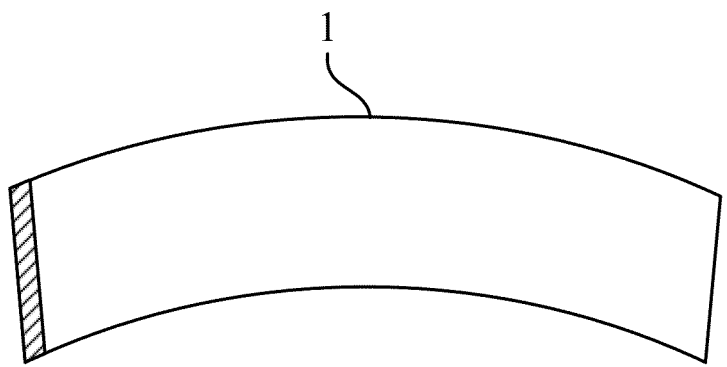
FIG. 4A is a schematic diagram illustrating the wafer of FIG. 1 under a three-point bending test.
Figure 4B:
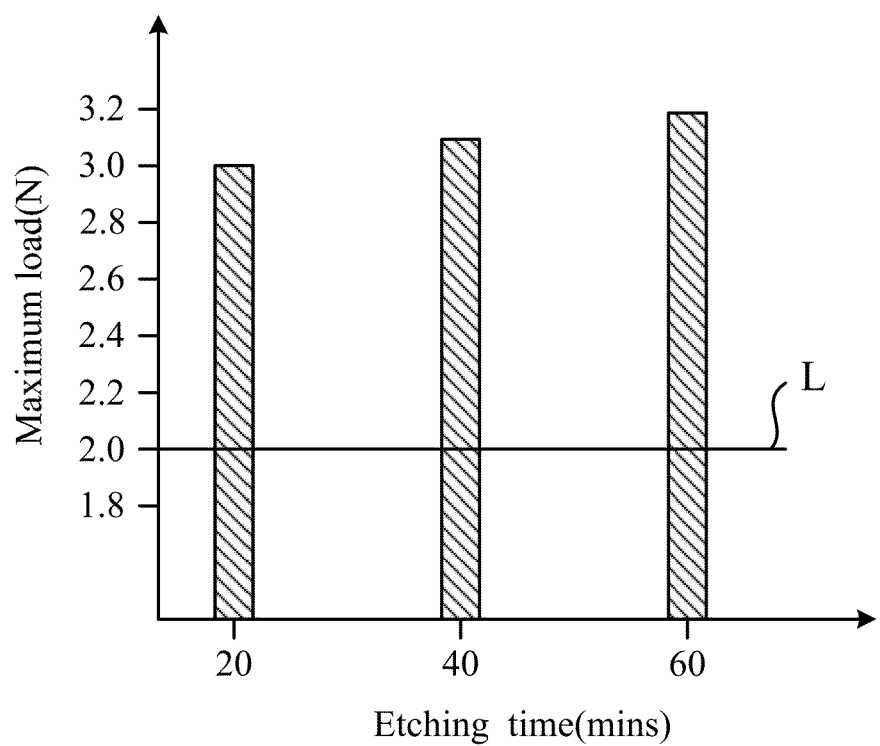
FIG. 4B is a diagram illustrating the relationship between the maximum load and the etching time according to the wafer of FIG. 4A.

Please refer to FIG. 4A and 4B. FIG. 4A is a schematic diagram illustrating the wafer of FIG. 1 under a three-point bending test; and, FIG. 4B is a diagram illustrating the relationship between the maximum load and the etching time according to the wafer of FIG. 4A. To be noticed, the characteristic curve shown in FIG. 4B is obtained by etching the side surface 12 of the wafer 1 with different etching time and performing a three-point bending test. For example, the method of electrochemical etching can be performed by immersing the side surface 12 of the wafer 1 into an etching liquid composed of HF and AgNO3 with a ratio of 250:1, as well as etching the side surface 12 within 20, 40, and 60 minutes respectively. As shown in FIG. 4B, the vertical axis indicates the maximum load of the wafer 1 (i.e., the tensile force produced by bending the wafer 1); and the horizontal axis indicates the etching time for forming the nanostructured layer 14. Additionally, the reference line L shows the maximum load of the wafer without forming the nanostructured layer on the side surface.

As shown in FIG. 4B, the wafer 1 with the nanostructured layer 14 fabricated by 20 minutes etching has a maximum load about 3N, and the maximum load of the wafer without the nanostructured layer 14 is only 2N. Moreover, with increasing the etching time, the maximum load of the wafer 1 may increase. Accordingly, the nanostructured layer fabricated on the side surface of the wafer can enhance the rupture resistance. Besides, the nanostructured layer 14 also allows the wafer 1 to bear more loading as well as enhance the flexibility of the wafer 1.

Therefore, with the advantages mentioned above, the manufacturing process of the wafer can be applied within various wafers, such as amorphous wafers, monocrystalline wafers, or polycrystalline wafers. In actual application, the wafer can be made from at least one of the group of glass, Si, Ge, C, Al, GaN, GaAs, GaP, AlN, sapphire, spinel, Al2O3, SiC, ZnO, MgO, LiAlO2, LiGaO2, and MgAl2O4, but it is not limited to this.

According to the embodiments mentioned above, the nanostructured layer 14 is formed on the side surface by etching; however, the present invention is not limited to this manner, the nanostructures can also be fabricated by epitaxy or coating, wherein the nanostructures can include, but not limited to nanotips and nanorods.

To be noticed, the material of the nanostructured layer and the wafer can be the same or different. More specifically, if the nanostructured layer is formed by etching the side surface of the wafer directly, the material of the nanostructured layer may be the same with the material of the wafer; or coating a heterogeneous film on the side surface before etching, the material of the nanostructured layer may be different from the material of the wafer.

Figure 5:
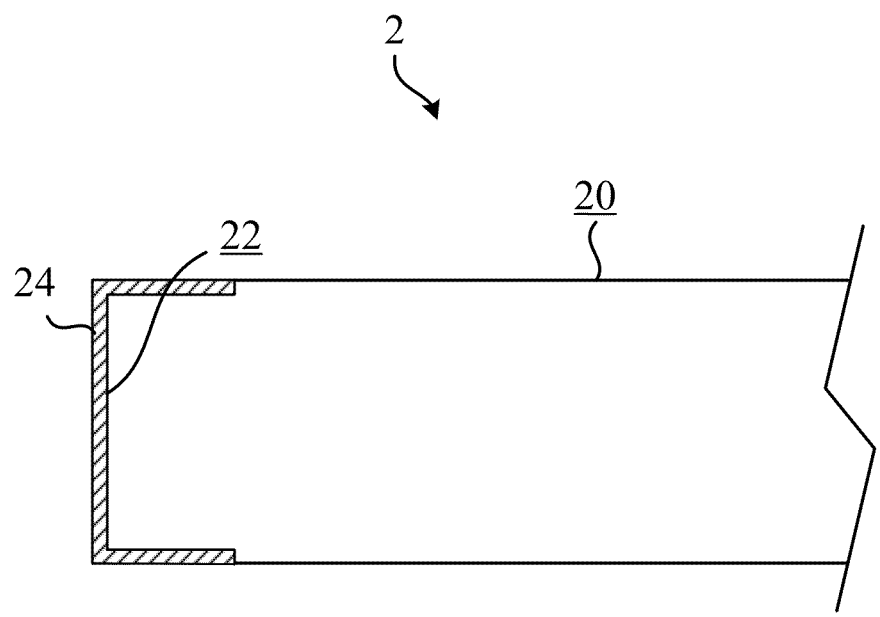
FIG. 5 is a sectional view of the wafer according to another embodiment of the invention.

Please refer to FIG. 5. FIG. 5 is a sectional view of the wafer according to another embodiment of the invention. As shown in FIG. 5, the nanostructured layer 24 can be formed within the range near the connected fringe of the largest surface 20 and the side surface 22. By the same token, the nanostructured layer 24 within the range at the fringe of the largest surface 20 is also capable of assisting the wafer 2 in resisting tensile force. In actual application, the nanostructured layer 24 within the range at the fringe of the largest surface 20 can be fabricated with the same manufacturing process of the nanostructured layer 24 on the side surface 22; that is to say, the nanostructured layer on the side surface and within the range at the fringe of the largest surface can be fabricated at the same time through etching the side surface and the fringe of the largest surface together. Generally, the range at the fringe of the largest surface is extended 1 cm from the fringe toward the center of the largest surface; however, the present invention is not limited to this form, the range at the fringe of the largest surface can be adjusted depending on demands.

Figure 6:
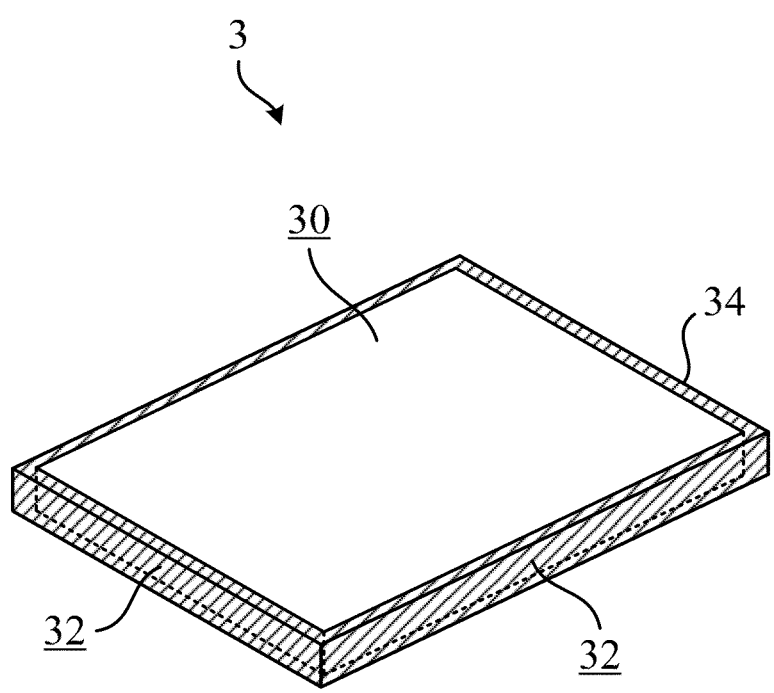
FIG. 6 is a schematic diagram of the wafer according to another embodiment of the invention.

In the embodiments described above, the nanostructured layer is formed on the entire side surface; in another embodiment, the nanostructured layer can be fabricated only on a part of the side surface or further to be formed on all the side surfaces. In theory, with increasing the coverage of the nanostructured layer, the rupture resistance can be enhanced. Please refer to FIG. 6. FIG. 6 is a schematic diagram of the wafer according to another embodiment of the invention. As shown in FIG. 6, the wafer 3 is a rectangular sheet body, and the largest surface 30 has a rectangular shape; wherein the four fringes of the largest surface 30 are connected with the four side surfaces 32 respectively, and the nanostructured layer 34 is formed on each side surface 32, so as to assist the stress dispersion of the wafer 3.

Figure 7:
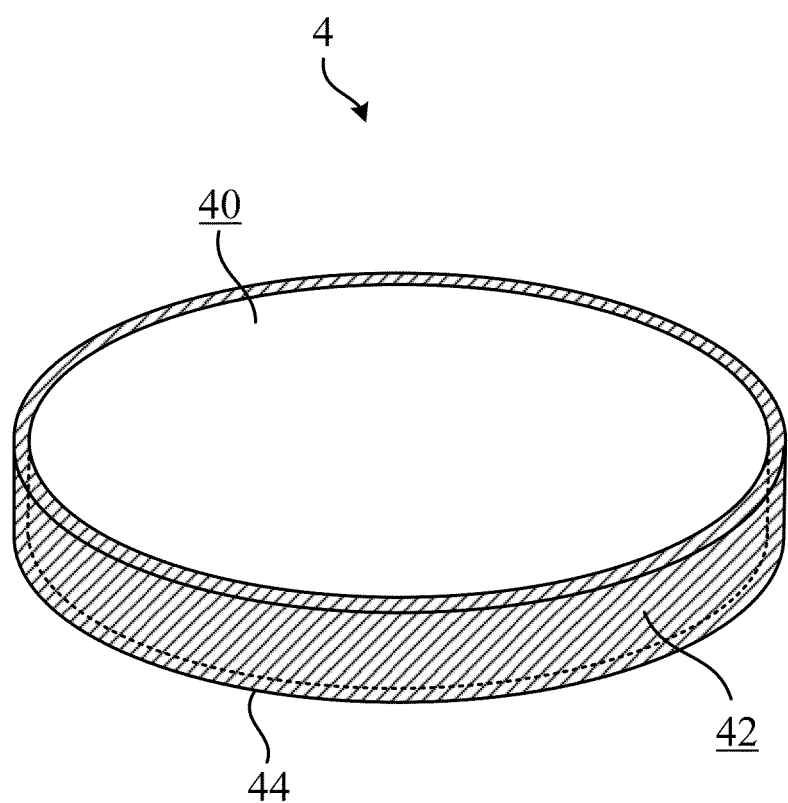
FIG. 7 is a schematic diagram of the wafer according to another embodiment of the invention.

On the other hand, the nanostructured layer can be fabricated on the side surfaces which are different in shape according to the shape of the wafer. Please refer to FIG. 7. FIG. 7 is a schematic diagram of the wafer according to another embodiment of the invention. As shown in FIG. 7, the wafer 4 is a circular sheet body, and the largest surface 40 has a circular shape; wherein the side surface 42 connected with the fringe of the largest surface 40 is an annular surface, and the nanostructured layer 44 is formed on the annular side surface 42, so as to enhance the rupture resistance of the wafer 4. In actual application, the shape of the largest surface of the wafer is including but not limited to rectangle, rhombus, circle, ellipse, and/or square.

According above stated, the wafer of the present invention includes a plurality of surfaces, wherein the surfaces include a largest surface having a largest area than others and a side surface connected to the fringe of the largest surface. The side surface forms a nanostructured layer thereon to assist the stress dispersion of the wafer. Therefore, the wafer of the present invention is provided with a high rupture resistance so as to prevent the wafer from damages during semiconductor or other processes.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A wafer with high rupture resistance, comprising:
a plurality of surfaces, including:
a largest surface having a largest area; and
a side surface connected to a fringe of the largest surface; and
a nanostructured layer formed on the side surface for assisting the stress dispersion of the wafer, wherein the nanostructured layer comprises a plurality of nanostructures, the nanostructures comprising at least one of nanorods and nanotips and being formed on the side surface by methods of wet etching, the material of the nanostructured layer being different than the material of the wafer.

2. The wafer of claim 1, wherein the included angle between the side surface and the largest surface is ranged from 0° to 180°.

3. The wafer of claim 2, wherein the included angle between the side surface and the largest surface is ranged from 45° to 90°.

4. The wafer of claim 1, wherein the side surface and the largest surface are interconnected by a fillet.

5. The wafer of claim 1, wherein the side surface is one of a rectangular surface and an annular surface.

6. The wafer of claim 1, wherein the largest surface of the wafer is one of a rectangle, a rhombus, a circle, an ellipse, and a square.

7. The wafer of claim 1, wherein the nanostructured layer is further formed within a range at the fringe of the largest surface, and the range is extended 1 cm from the fringe toward the center of the largest surface.

8. The wafer of claim 1, wherein the nanostructures have a spacing of 10 to 1000 nanometer (nm) between the tops of the nanostructures.

9. The wafer of claim 1, wherein the nanostructures have a depth of 0.1 to 100 micrometer (μm).

10. The wafer of claim 1, wherein the wafer is one of an amorphous wafer, a monocrystalline wafer, and a polycrystalline wafer.

11. The wafer of claim 10, wherein the monocrystalline wafer is a monocrystalline silicon wafer.

12. The wafer of claim 10, wherein the wafer is made from at least one of the group of glass, Si, Ge, C, Al, GaN, GaAs, GaP, AlN, sapphire, spinel, Al2O3, SiC, ZnO, MgO, LiAlO2, LiGaO2, and MgAl2O4.

13. The wafer of claim 1, wherein the wafer is a p-type semiconductor, and there is an n-type semiconductor formed on the largest surface.

14. The wafer of claim 1, wherein the wafer is an n-type semiconductor, and there is a p-type semiconductor formed on the largest surface.

15. The wafer of claim 1, wherein the material of the nanostructured layer is the same with the material of the wafer.

16. The wafer of claim 1, wherein the material of the nanostructured layer is different from the material of the wafer.

17. The wafer of claim 1, wherein the wafer is one of a solar cell wafer, a LED wafer, and a semiconductor wafer.

* * * * *